(12) United States Patent
Saimen

(10) Patent No.: US 8,016,181 B2
(45) Date of Patent: Sep. 13, 2011

(54) METHOD OF PRODUCING ELECTRO-OPTICAL DEVICE USING ANISOTROPIC CONDUCTIVE ADHESIVE CONTAINING CONDUCTIVE PARTICLES TO BOND TERMINAL PORTIONS AND ELECTRO-OPTICAL DEVICE

(75) Inventor: Munehide Saimen, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/365,636

(22) Filed: Feb. 4, 2009

(65) Prior Publication Data

US 2009/0197111 A1    Aug. 6, 2009

(30) Foreign Application Priority Data

Feb. 6, 2008   (JP) ................. 2008-026021

(51) Int. Cl.
*B23K 31/00* (2006.01)
*B23K 31/02* (2006.01)
(52) U.S. Cl. ............... 228/179.1; 228/233.2; 228/248.1
(58) Field of Classification Search .................. None
See application file for complete search history.

(56) References Cited

U.S. PATENT DOCUMENTS

| | | | | |
|---|---|---|---|---|
| 4,740,657 A * | 4/1988 | Tsukagoshi et al. | ....... | 174/88 R |
| 5,634,268 A * | 6/1997 | Dalal et al. | ....... | 29/840 |
| 5,918,113 A * | 6/1999 | Higashi et al. | ....... | 438/119 |
| 6,223,429 B1 * | 5/2001 | Kaneda et al. | ....... | 29/832 |
| 6,337,522 B1 * | 1/2002 | Kang et al. | ....... | 257/784 |
| 6,365,840 B1 * | 4/2002 | Honda et al. | ....... | 174/259 |
| 6,388,321 B1 * | 5/2002 | Hirai et al. | ....... | 257/737 |
| 6,452,111 B1 * | 9/2002 | Kumakura | ....... | 174/259 |
| 6,764,938 B2 * | 7/2004 | Akamatsu et al. | ....... | 438/613 |
| 6,833,180 B1 * | 12/2004 | Kodemura | ....... | 428/220 |
| 7,531,385 B1 * | 5/2009 | Karashima et al. | ....... | 438/119 |
| 7,531,387 B1 * | 5/2009 | Karashima et al. | ....... | 438/127 |
| 7,537,961 B2 * | 5/2009 | Nakatani et al. | ....... | 438/108 |
| 2002/0185309 A1 * | 12/2002 | Imamura et al. | ....... | 174/261 |
| 2007/0257362 A1 * | 11/2007 | Karashima et al. | ....... | 257/737 |
| 2008/0017995 A1 * | 1/2008 | Karashima et al. | ....... | 257/778 |
| 2009/0008776 A1 * | 1/2009 | Kitae et al. | ....... | 257/737 |
| 2009/0085227 A1 * | 4/2009 | Shiraishi et al. | ....... | 257/778 |
| 2009/0126876 A1 * | 5/2009 | Karashima et al. | ....... | 156/556 |
| 2009/0208731 A1 * | 8/2009 | Saimen | ....... | 428/327 |
| 2010/0006625 A1 * | 1/2010 | Eom et al. | ....... | 228/164 |

FOREIGN PATENT DOCUMENTS

| | | | | |
|---|---|---|---|---|
| JP | 07153795 | A | * | 6/1995 |
| JP | 08186156 | A | * | 7/1996 |
| JP | 11219982 | A | * | 8/1999 |
| JP | 2007-48801 | A | | 2/2007 |
| WO | WO 2006064831 | A1 | * | 6/2006 |

* cited by examiner

*Primary Examiner* — Kiley Stoner
*Assistant Examiner* — Carlos Gamino
(74) *Attorney, Agent, or Firm* — AdvantEdge Law Group, LLC

(57) ABSTRACT

A method of producing an electro-optical device for electrically connecting a first terminal portion provided on an electro-optical panel to a second terminal portion of a substrate includes applying an anisotropic conductive adhesive containing conductive particles made of a low-melting-point material onto either the first terminal portion or the second terminal portion, and electrically connecting the first terminal portion to the second terminal portion by eutectic bonding by melting the conductive particles by application of heat in thermocompression bonding of the second terminal portion to the first terminal portion with the anisotropic conductive adhesive therebetween.

2 Claims, 7 Drawing Sheets

METHOD OF PRODUCING ELECTRO-OPTICAL DEVICE USING ANISOTROPIC CONDUCTIVE ADHESIVE CONTAINING CONDUCTIVE PARTICLES TO BOND TERMINAL PORTIONS AND ELECTRO-OPTICAL DEVICE

BACKGROUND

1. Technical Field

The present invention relates to a method of producing an electro-optical device for electrically connecting a first terminal portion provided on an electro-optical panel to a second terminal portion of a thin sheet substrate, and an electro-optical device.

2. Related Art

As is generally known, in an electro-optical device, for example, a light-transmissive liquid crystal device, a liquid crystal panel which is an electro-optical panel in which liquid crystal is disposed between two substrates made of glass, quartz, or the like is accommodated in a packaging case or the like.

In such a liquid crystal device, switching elements such as thin film transistors (hereinafter referred to as "TFTs") and pixel electrodes are arranged on one of the substrates of the liquid crystal panel in a matrix pattern, and a counter electrode is arranged on the other substrate. An optical response of a liquid crystal layer disposed between the substrates is changed in accordance with image signals, thus enabling image display.

A TFT substrate on which TFTs are arranged and a counter substrate disposed so as to face the TFT substrate are separately produced. Each of the TFT substrate and the counter substrate is produced by laminating a semiconductor thin film, an insulating thin film, or a conducting thin film having a predetermined pattern on, for example, a quartz substrate. The semiconductor thin film, insulating thin film, or conducting thin film is formed by repeating a step of film deposition and a step of photolithography for each layer.

For example, when liquid crystal is provided between the TFT substrate and the counter substrate by a liquid crystal injecting method, the TFT substrate and the counter substrate thus produced are bonded with high accuracy (for example, within an alignment error of 1 μm) in a step of assembling a panel with a sealing material therebetween applied onto substantially the periphery of the substrates so as to have an opening in a part.

Subsequently, alignment is performed, and the substrates are pressure-bonded to cure the sealing material. Liquid crystal is then injected through the opening provided in the part of the sealing material. The opening is then sealed with a sealant cured by heating or the like.

For example, the TFT substrate is formed so as to be larger than the counter substrate in plan view. In this case, external connection terminals are arranged on a projecting portion disposed on a part of a surface of the TFT substrate, the surface having the counter substrate thereon, in a width direction connecting an edge of the liquid crystal panel to another edge thereof. Terminal portions of a flexible printed circuit (hereinafter referred to as "FPC") which is a flexible, thin sheet substrate (not shown) having a specific length, the terminal portions being used for providing an electrical connection to external circuits of an electronic apparatus such as a projector, are electrically connected to the external connection terminals.

The terminal portions of the FPC are electrically connected to the external connection terminals by thermocompression bonding or the like via, for example, conductive particles such as metal particles in an anisotropic conductive adhesive such as an anisotropic conductive film (hereinafter referred to as "ACF") or an anisotropic conductive paste (hereinafter referred to as "ACP"). Finally, the liquid crystal panel is accommodated in a packaging case or the like, thus producing a liquid crystal device.

For example, JP-A-2007-48801 discloses such a structure in which terminals are connected to each other via conductive particles in an anisotropic conductive adhesive. Specifically, JP-A-2007-48801 discloses a structure in which an electrical connection between terminals is reliably established by partially embedding metal particles, which function as conductive particles, mixed with an adhesive in a predetermined ratio in each of the terminals.

For example, a method of producing the above-mentioned TFT substrate is well known. Specifically, for example, a plurality of TFT substrates formed on a single large-plate quartz substrate are cut to a predetermined size, thereby producing the plurality of TFT substrates at the same time. When the size of the TFT substrates is decreased, the number of TFT substrates that can be produced at the same time using a single large-plate quartz substrate is increased, and thus the production cost can be reduced. This also applies to counter substrates.

However, when the size of the TFT substrates is decreased, the areas of external connection terminals are also decreased, that is, the connection areas of terminal portions of the FPC facing the external connection terminals are also decreased. Consequently, after connection, the terminal portions of the FPC are easily detached from the external connection terminals.

Accordingly, it has been desired to provide a method and structure in which an electrical connection between terminals can be reliably established, as compared with the method and structure disclosed in JP-A-2007-48801 in which terminals are electrically connected to each other by partially embedding conductive particles in each of the terminals.

SUMMARY

An advantage of some aspects of the invention is to provide a method of producing an electro-optical device whose reliability can be improved by reliably electrically connecting terminals to each other, and the electro-optical device.

According to a first aspect of the invention, a method of producing an electro-optical device for electrically connecting a first terminal portion provided on an electro-optical panel to a second terminal portion of a substrate includes applying an anisotropic conductive adhesive containing conductive particles made of a low-melting-point material onto either the first terminal portion or the second terminal portion; and electrically connecting the first terminal portion to the second terminal portion by eutectic bonding by melting the conductive particles by application of heat in thermocompression bonding of the second terminal portion to the first terminal portion with the anisotropic conductive adhesive therebetween.

In the first aspect of the invention, in the thermocompression bonding for connecting, the first terminal portion is electrically connected to the second terminal portion by eutectic bonding by melting the conductive particles in the anisotropic conductive adhesive by application of heat. Accordingly, the contact area of the conductive particle with each of the terminal portions is larger than that in a known method in which a first terminal portion is electrically connected to a second terminal portion by partially embedding a conductive particle. Therefore, the first terminal portion can be reliably electrically connected to the second terminal portion to improve reliability of the electro-optical device.

The conductive particles are preferably made of a low-melting-point material having a melting point of 500° C. or lower.

In this case, in the thermocompression bonding, the first terminal portion can be reliably electrically connected to the second terminal portion by eutectic bonding via the melted and spread conductive particle without providing the electro-optical panel with damage due to high heat.

Furthermore, the low-melting-point material may be composed of a metal particle.

In this case, in the thermocompression bonding, the first terminal portion can be reliably electrically connected to the second terminal portion by eutectic bonding via the melted and spread metal particle without providing the electro-optical panel with damage due to high heat.

The low-melting-point material may be composed of a resin core particle made of a resin coated with a metal plating layer made of a low-melting-point material having a melting point of 500° C. or lower.

In this case, in the thermocompression bonding, the first terminal portion can be reliably electrically connected to the second terminal portion by eutectic bonding via the melted and spread metal plating layer of the resin core particle without providing the electro-optical panel with damage due to high heat.

Furthermore, the thermocompression bonding for connecting is preferably performed at a temperature higher than the melting point of the conductive particles.

In this case, the conductive particles can be reliably melted, and thus the first terminal portion can be reliably electrically connected to the second terminal portion by eutectic bonding.

A second aspect of the invention provides an electro-optical device produced by the method according to the first aspect of the invention.

According to the structure of this electro-optical device, a first terminal portion is electrically connected to a second terminal portion by eutectic bonding via conductive particles in an anisotropic conductive adhesive, the conductive particles being melted and spread by application of heat during thermocompression bonding. Accordingly, the contact area of the conductive particle with each of the terminal portions is larger than that in a known structure in which a first terminal portion is electrically connected to a second terminal portion by partially embedding a conductive particle. Therefore, the first terminal portion can be reliably electrically connected to the second terminal portion to improve reliability of the electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the drawings. In the embodiments described below, an electro-optical device will be described using a light-transmissive liquid crystal device as an example. Accordingly, an electro-optical panel of the electro-optical device will be described using a liquid crystal panel as an example.

Regarding a pair of substrates disposed so as to face each other in the liquid crystal panel, one of the substrates will be described using an element substrate (hereinafter referred to as "TFT substrate") as an example, and the other substrate will be described using a counter substrate facing the TFT substrate as an example. Furthermore, an anisotropic conductive adhesive will be described using the above-mentioned ACF as an example.

Figure 1:
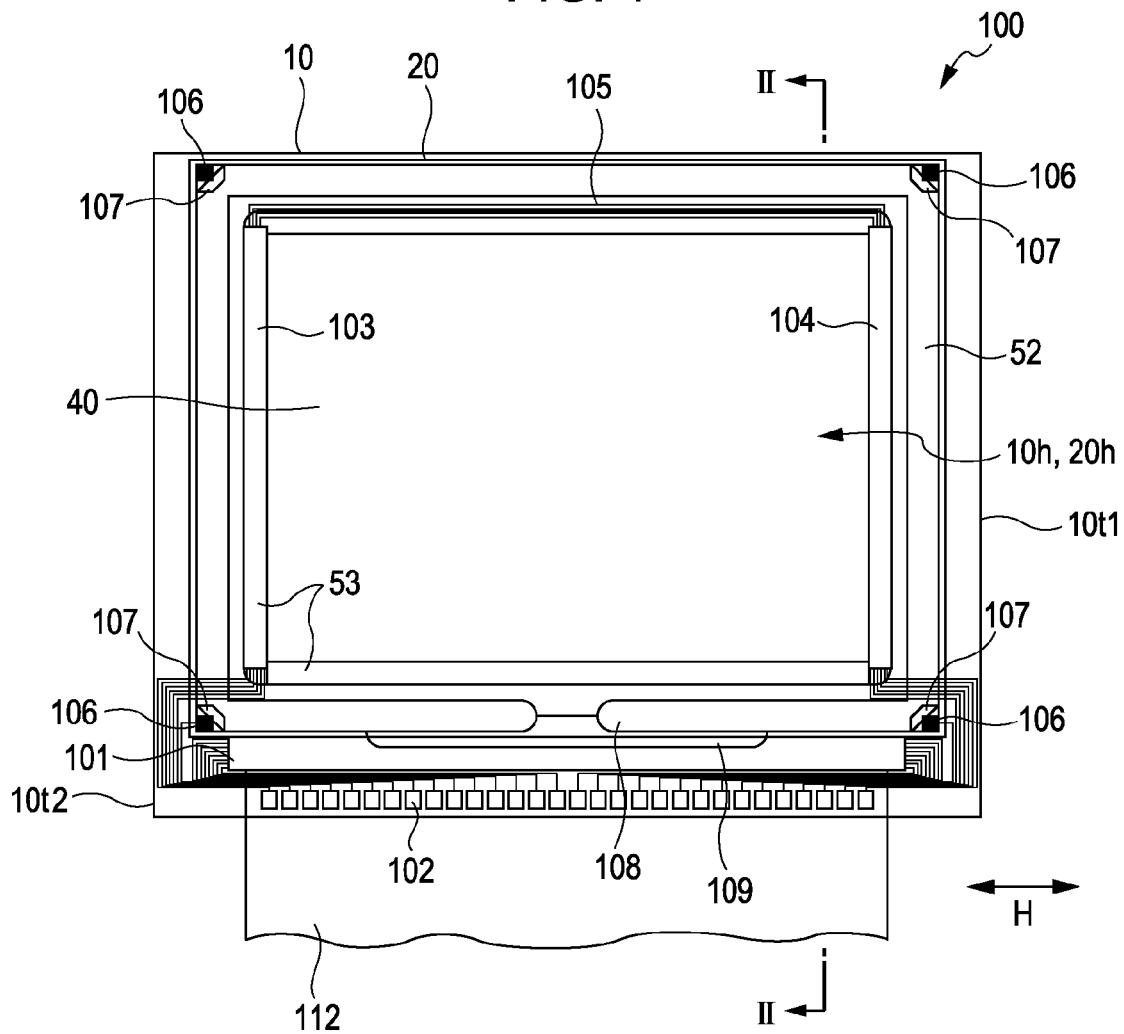
FIG. 1 is a plan view showing a liquid crystal panel of a liquid crystal device and an FPC produced by a production method according to an embodiment.
Figure 2:
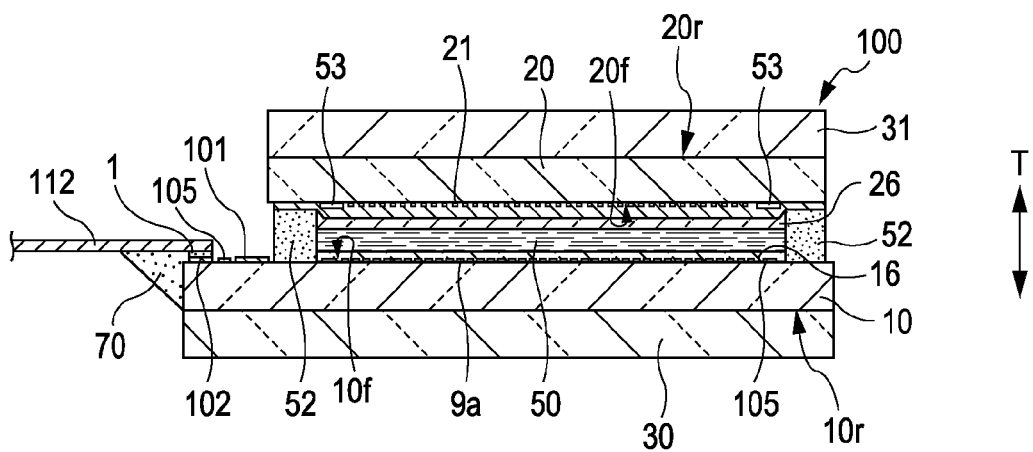
FIG. 2 is a cross-sectional view of the liquid crystal panel and the FPC taken along line II-II in FIG. 1.

First, the structure of a liquid crystal device produced by a production method according to this embodiment will now be described with reference to FIGS. 1 and 2. FIG. 1 is a plan view showing a liquid crystal panel of the liquid crystal device and an FPC produced by the production method according to this embodiment. FIG. 2 is a cross-sectional view of the liquid crystal panel and the FPC taken along line II-II in FIG. 1.

As shown in FIGS. 1 and 2, a liquid crystal panel 100 includes a TFT substrate 10 made of, for example, quartz or glass and a counter substrate 20 disposed so as to face the TFT substrate 10 and made of, for example, glass or quartz. The outer shape of the counter substrate 20 is smaller than that of the TFT substrate 10. Liquid crystal 50 is disposed in an inner space between the TFT substrate 10 and the counter substrate 20. The TFT substrate 10 and the counter substrate 20, which face each other, are bonded with a sealing material 52.

A display area 10h of the TFT substrate 10 constituting a display area 40 of the liquid crystal panel 100 is provided in an area of the TFT substrate 10, the area contacting the liquid crystal 50. Pixel electrodes 9a that constitute pixels and that apply a drive voltage to the liquid crystal 50 together with a counter electrode 21 described below are arranged in a matrix pattern in the display area 10h at a surface 10f side of the TFT substrate 10, the surface 10f facing the counter substrate 20.

The counter electrode 21 that applies a drive voltage to the liquid crystal 50 together with the pixel electrodes 9a is provided in an area of a surface 20*f* side of the counter substrate 20, the area contacting the liquid crystal 50. A display area 20*h* of the counter substrate 20 constituting the display area 40 of the liquid crystal panel 100 is provided in an area of the counter electrode 21, the area facing the display area 10*h*.

An alignment layer 16 which has been subjected to a rubbing treatment is provided on the pixel electrodes 9*a* on the TFT substrate 10. An alignment layer 26 which has been subjected to a rubbing treatment is further provided on the counter electrode 21 formed over the entire surface of the counter substrate 20. Each of the alignment layers 16 and 26 is composed of, for example, a transparent organic film such as a polyimide film.

In the display area 10*h* of the TFT substrate 10, a plurality of scanning lines (not shown) and a plurality of data lines (not shown) are arranged so as to cross each other. The pixel electrodes 9*a* are arranged in a matrix pattern in areas defined by the scanning lines and the data lines. TFTs (not shown) are provided so as to correspond to positions at which the scanning lines and the data lines cross each other. Each of the pixel electrodes 9*a* is electrically connected to the corresponding TFT.

The TFT turns to the ON state by an ON signal of the scanning line. Consequently, an image signal supplied to the data line is supplied to the pixel electrode 9*a*. A voltage between the pixel electrode 9*a* and the counter electrode 21, which is provided on the counter substrate 20, is applied to the liquid crystal 50.

A light-shielding film 53 serving as a frame specifying the display area 40 of the liquid crystal panel 100 is provided on the counter substrate 20.

In the case where the liquid crystal 50 is injected into a space between the TFT substrate 10 and the counter substrate 20 by a known liquid crystal injecting method, the sealing material 52 is applied so that the sealing material 52 is not provided in a part of one side of the sealing material 52.

The part in which the sealing material 52 is not provided constitutes a liquid crystal inlet 108 functioning as an opening through which the liquid crystal 50 is injected into the area surrounded by the sealing material 52 in a space between the TFT substrate 10 and the counter substrate 20 which are bonded to each other at the periphery except for at the part. The liquid crystal inlet 108 is sealed with a sealant 109 after the injection of the liquid crystal 50.

On the surface 10*f* of the TFT substrate 10, a data-line driving circuit 101 and external connection terminals 102 are provided in an area outside the sealing material 52 on a side face side in a width direction H connecting an edge 10*t*1 of the TFT substrate 10 to another edge 10*t*2 of the TFT substrate 10. The data-line driving circuit 101 is a driver that supplies data lines (not shown) of the TFT substrate 10 with image signals at a predetermined timing to drive the data lines. The external connection terminals 102 are first terminal portions for connecting to external circuits.

Alternatively, the external connection terminals 102 may be provided on the counter substrate 20. The external connection terminals 102 are made of an electrically conductive material such as aluminum or indium tin oxide (ITO). Furthermore, FIG. 1 does not show the specific number of pins, but in general, the number of external connection terminals 102 is about 100 to 1,000 pins. An appropriate number of external connection terminals 102 are provided depending on the type of the liquid crystal panel.

Terminal portions 113 (see FIG. 5) are electrically connected to the external connection terminals 102 by, for example, pressure bonding with an ACF 1 therebetween. The terminal portions 113 are second terminal portions provided at an end of the FPC 112 that provides an electrical connection between the liquid crystal panel 100 and an electronic apparatus such as a projector (not shown) and that has a specific length. The structure of the ACF 1 will be described below.

Each of the terminal portions 113 is composed of, for example, a copper film on which nickel and gold films are formed by plating, a copper film on which a gold film is formed by plating, or a copper film on which a tin film is formed by plating. The materials constituting the terminal portions 113 are not limited to the above materials.

The liquid crystal panel 100 is electrically connected to the electronic apparatus by connecting another end of the FPC 112 to the external circuits of the electronic apparatus. The connection structure between the external connection terminals 102 and the terminal portions 113 of the FPC 112 via the ACF 1 will be also described below.

In order to reinforce the electrical connection between the external connection terminals 102 and the terminal portions 113, for example, a photocurable adhesive 70 is linearly provided between the FPC 112 and a side face of the TFT substrate 10 in the width direction H.

Scanning-line driving circuits 103 and 104 are provided on the surface 10*f* of the TFT substrate 10 along side faces adjacent to a side face of the TFT substrate 10, the side face having the external connection terminals 102 thereon. The scanning-line driving circuits 103 and 104 are drivers that drive gate electrodes (not shown) by supplying the scanning lines and the gate electrodes of the TFT substrate 10 with scanning signals at a predetermined timing. The scanning-line driving circuits 103 and 104 are provided on the surface 10*f* of the TFT substrate 10 at positions facing the light-shielding film 53 disposed inside the sealing material 52.

Furthermore, wiring 105 connecting the data-line driving circuit 101, the scanning-line driving circuits 103 and 104, the external connection terminals 102, and vertically conducting terminals 107 are provided on the surface 10*f* of the TFT substrate 10 so as to face three sides of the light-shielding film 53.

The vertically conducting terminals 107 are provided on the TFT substrate 10 at four positions of the corners of the sealing material 52. Furthermore, vertically conducting members 106 are provided between the TFT substrate 10 and the counter substrate 20. The lower end of each of the vertically conducting members 106 is in contact with the vertically conducting terminal 107, and the upper end thereof is in contact with the counter electrode 21. The TFT substrate 10 is electrically connected to the counter substrate 20 with the vertically conducting members 106 therebetween.

A cover glass 30 is bonded on a reverse face 10*r* of the TFT substrate 10. Similarly, a cover glass 31 is bonded on a reverse face 20*r* of the counter substrate 20.

The cover glasses 30 and 31 prevent dust or the like from being attached to at least the display areas 10*h* and 20*h* of the reverse faces 10*r* and 20*r* of the TFT substrate 10 and the counter substrate 20, respectively. In addition, the cover glasses 30 and 31 have a function of making images of dust or the like invisible by separating the dust or the like from the reverse face 10*r* and 20*r*, respectively, and causing images of them to be defocused.

Next, a method of producing a liquid crystal device having the above structure, more specifically, a method of connecting terminal portions of an FPC to external connection terminals will be described with reference to FIGS. 3 to 7. A method of producing the liquid crystal device other than the method of connecting the terminal portions of the FPC to the external connection terminals is well known, and thus, a description thereof is omitted.

Figure 3:
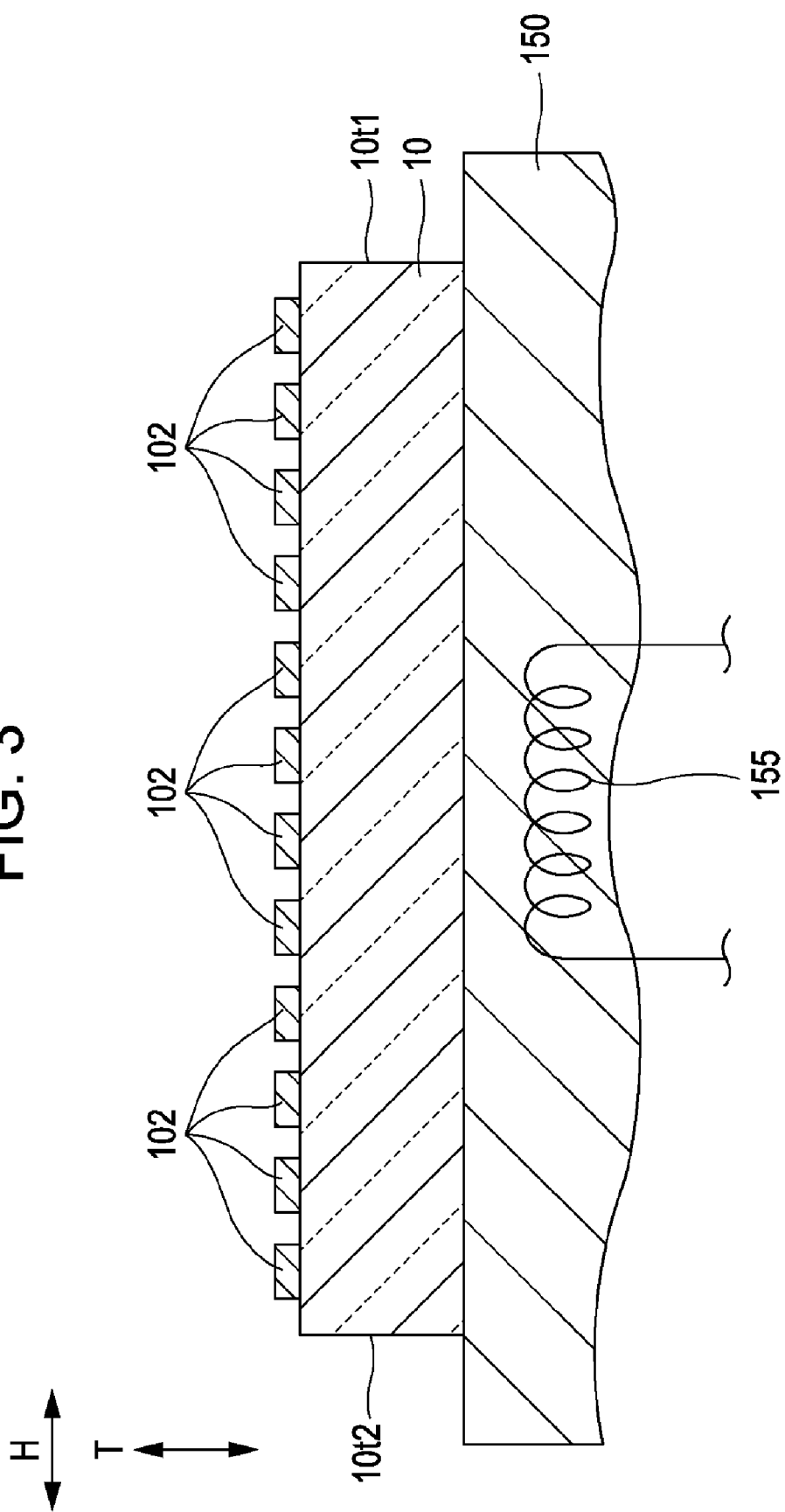
FIG. 3 is a cross-sectional view that schematically shows a state in which external connection terminals are provided on a TFT substrate disposed on a stage.
Figure 4:
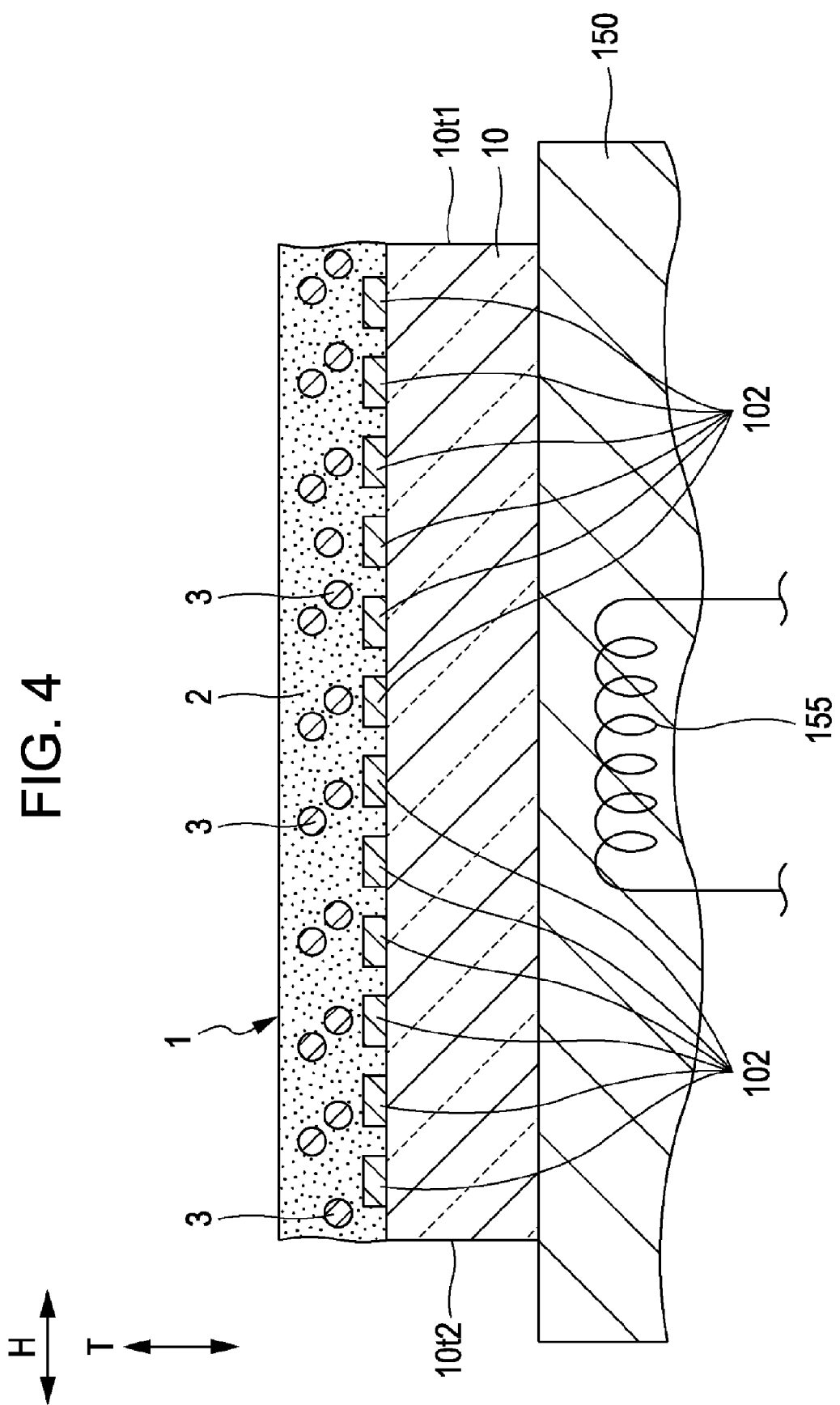
FIG. 4 is a cross-sectional view that schematically shows a state in which an ACF is laminated on the external connection terminals shown in FIG. 3.
Figure 5:
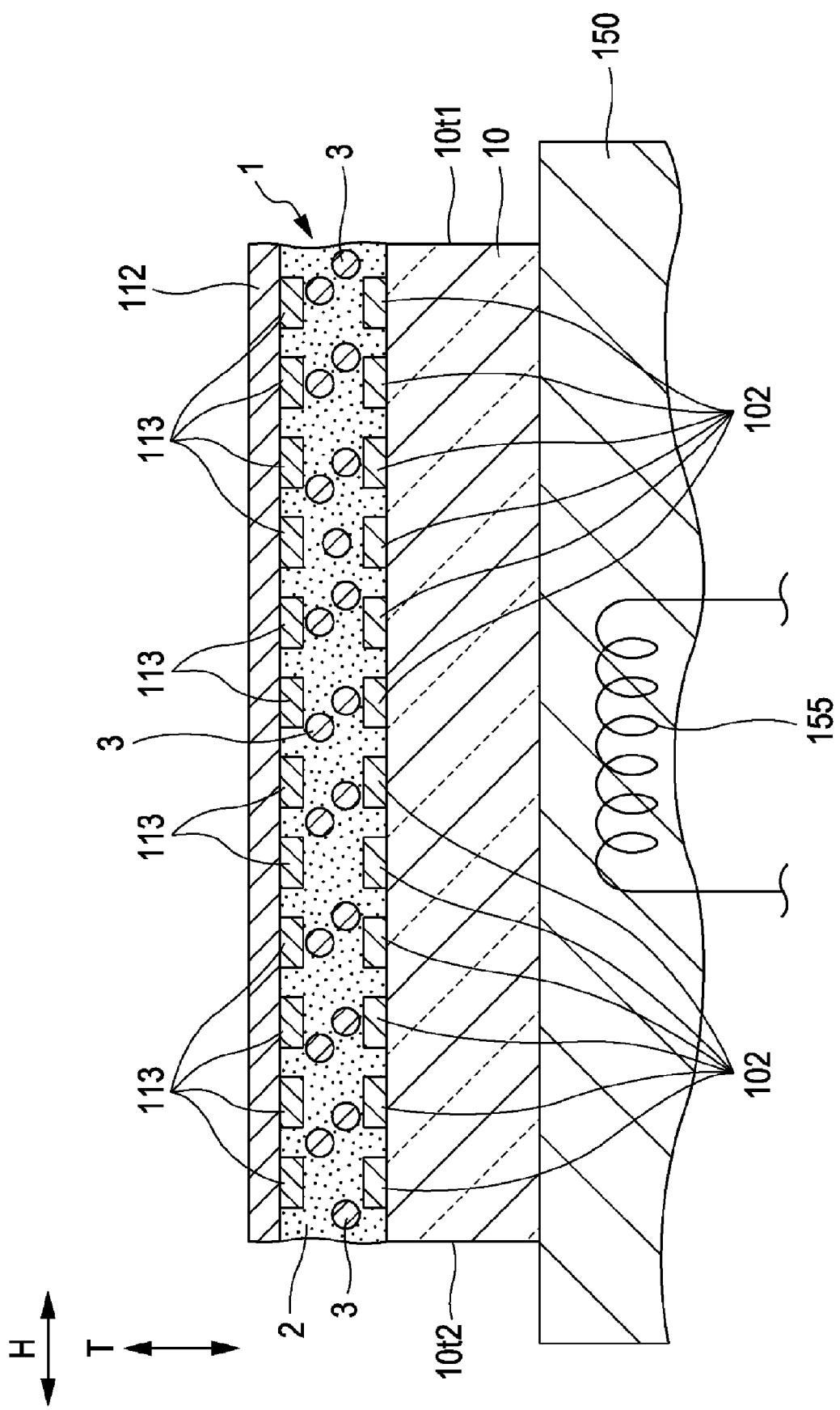
FIG. 5 is a cross-sectional view that schematically shows a state in which terminal portions of an FPC are laminated on the external connection terminals with the ACF shown in FIG. 4 therebetween.

FIG. 3 is a cross-sectional view that schematically shows a state in which external connection terminals are provided on a TFT substrate disposed on a stage. FIG. 4 is a cross-sectional view that schematically shows a state in which an ACF is laminated on the external connection terminals shown in FIG. 3. FIG. 5 is a cross-sectional view that schematically shows a state in which terminal portions of an FPC are laminated on the external connection terminals with the ACF shown in FIG. 4 therebetween.

Figure 6:
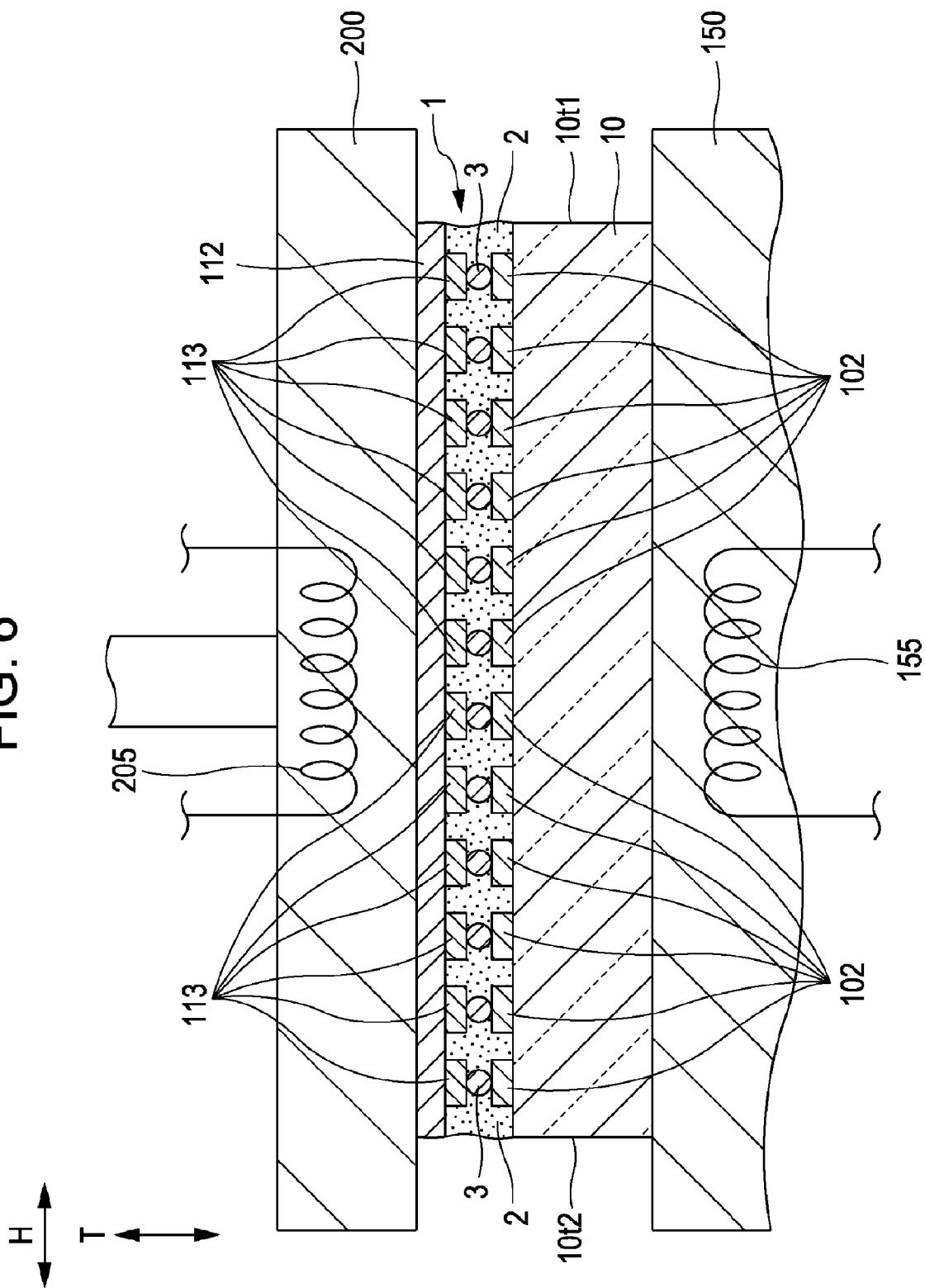
FIG. 6 is a cross-sectional view that schematically shows a state in which the terminal portions of the FPC are pressure-bonded to the external connection terminals with the ACF therebetween using a bonding tool, the state being subsequent to the laminated state shown in FIG. 5.
Figure 7:
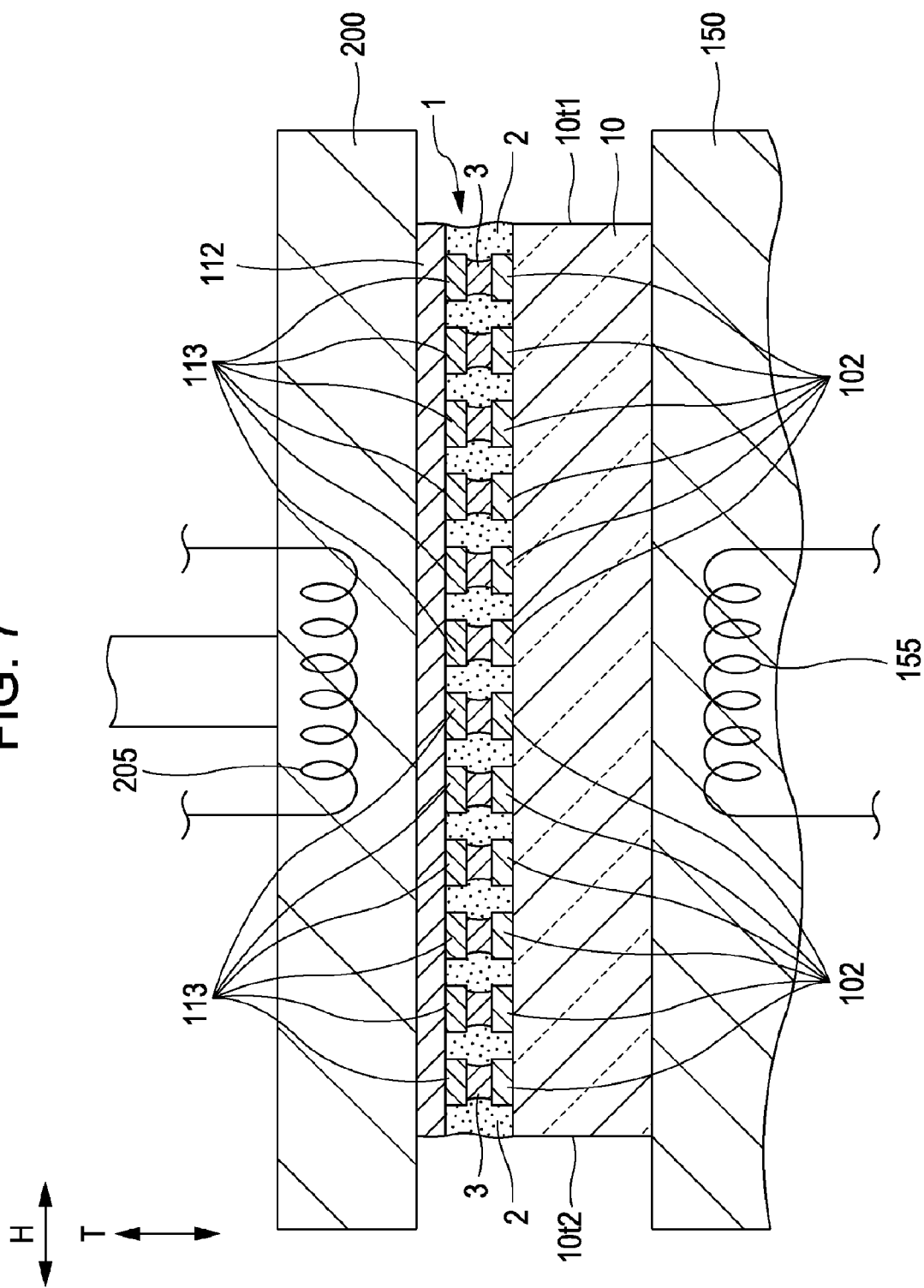
FIG. 7 is a cross-sectional view that schematically shows a state in which, after the pressure bonding shown in FIG. 6, first terminal portions are electrically connected to second terminal portions by eutectic bonding by applying heat to the ACF to melt conductive particles.

FIG. 6 is a cross-sectional view that schematically shows a state in which the terminal portions of the FPC are pressure-bonded to the external connection terminals with the ACF therebetween using a bonding tool, the state being subsequent to the laminated state shown in FIG. 5. FIG. 7 is a cross-sectional view that schematically shows a state in which, after the pressure bonding shown in FIG. 6, first terminal portions are electrically connected to second terminal portions by eutectic bonding by applying heat to the ACF to melt conductive particles.

In FIGS. 3 to 7, in order to simplify the figures, the number of external connection terminals is smaller than that of FIG. 1. Furthermore, in FIGS. 3 to 7, in order to simplify the figures, the number of conductive particles is smaller than the actual number of conductive particles.

First, as shown in FIG. 3, a TFT substrate 10 having external connection terminals 102 thereon is placed on a heater stage 150 having a heater 155. As shown in FIG. 4, an ACF 1 is then applied onto the external connection terminals 102 of the TFT substrate 10, that is, an application step is performed.

The main portion of the ACF 1 is composed of an insulating adhesive material 2 and conductive particles 3 diffused in the insulating adhesive material 2. For example, the conductive particles 3 are composed of metal particles made of a low-melting-point material having a melting point of 500° C. or lower, namely, a solder, tin, or the like, and have a predetermined particle diameter of, for example, 2 to 3 μm. Hereinafter, the conductive particles 3 will be described using metal particles composed of a solder having a melting point in the range of about 260° C. to 280° C.

After the completion of the application step shown in FIG. 4, a connection step of electrically connecting terminal portions 113 of an FPC 112 to the external connection terminals 102 with the ACF 1 therebetween is performed.

Specifically, first, as shown in FIG. 5, the FPC 112 is laminated on the external connection terminals 102 so that each of the terminal portions 113 faces the corresponding external connection terminal 102 with the ACF 1 therebetween. Subsequently, the heater stage 150 is heated in advance with the heater 155 at a temperature in the range of about 60° C. to 120° C.

Next, as shown in FIG. 6, the terminal portions 113 are pressure-bonded to the external connection terminals 102 with the ACF 1 therebetween from above in a thickness direction T of the FPC 112 using a known pressure-bonding device (hereinafter referred to as "bonding tool") 200 having a heater 205.

More specifically, the ACF 1 is pressed from above in the thickness direction T of the FPC 112 using the bonding tool 200 that is heated with the heater 205 to a temperature higher than the melting point of the solder constituting the conductive particles 3, for example, about 500° C. Thereby, thermocompression bonding for electrically connecting the terminal portions 113 to the external connection terminals 102 is performed for, for example, 2 to 3 seconds.

The reason why the thermocompression bonding is performed for only 2 to 3 seconds is that applying heat as high as 500° C. to a liquid crystal panel 100 for a long time may adversely affect the liquid crystal panel 100. Specifically, for example, a problem of degradation of liquid crystal 50 may occur.

As a result of the thermocompression bonding, heat is applied to the ACF 1, and the conductive particles 3 composed of the solder having a melting point in the range of about 260° C. to 280° C. are melted and spread in the form of a fillet as shown in FIG. 7 by the application of heat from the bonding tool 200 and the heater stage 150. The melted and spread conductive particles 3 electrically connect the external connection terminals 102 to the terminal portions 113 of the FPC 112 by known eutectic bonding.

In this case, since the conductive particles 3 are melted and spread, the conductive particles 3 electrically connect the external connection terminals 102 to the terminal portions 113 in such a manner that the connection area is larger than that in a known method of electrically connecting external connection terminals 102 to terminal portions 113 at the upper end and the lower end of each conductive particle 3 in the thickness direction T.

In the illustration of FIG. 7, a pair of external connection terminal 102 and terminal portion 113 are electrically connected with a single melted and spread conductive particle 3 therebetween. However, actually, the external connection terminal 102 and the terminal portion 113 are electrically connected via a plurality of melted and spread conductive particles 3 in plan view.

As described above, in this embodiment, in the connection step, the conductive particles 3 in the ACF 1 are melted in the form of a fillet by applying heat to electrically connect the external connection terminals 102 to the terminal portions 113 by eutectic bonding.

According to this feature, the contact area of the conductive particle 3 with each of the external connection terminals 102 and corresponding terminal portion 113 increases as compared with the known method in which external connection terminals 102 and terminal portions 113 are electrically connected by partially embedding conductive particles 3. Accordingly, the external connection terminals 102 and the terminal portions 113 can be reliably electrically connected to improve reliability of the liquid crystal device.

In this embodiment, the conductive particles 3 in the ACF 1 are composed of metal particles made of a material having a melting point of 500° C. or lower, specifically, a solder having a melting point in the range of about 260° C. to 280° C.

According to this feature, in the thermocompression bonding, the external connection terminals 102 and the terminal portions 113 can be reliably electrically connected via the melted and spread solder by eutectic bonding without providing the liquid crystal panel 100 with damage due to high heat.

Furthermore, in this embodiment, the thermocompression bonding in the connection step using the bonding tool 200 is performed at a temperature higher than the melting point of the conductive particles 3.

According to this feature, since the conductive particles 3 can be reliably melted, the external connection terminals 102 can be reliably electrically connected to the terminal portions 113 by eutectic bonding.

A modification will now be described. In the above embodiment, the conductive particles 3 have been described using metal particles made of a solder having a melting point in the range of about 260° C. to 280° C. as an example. However, the conductive particles 3 are not limited to this, and may be made of another solder as long as the solder has a melting point of 500° C. or lower. Alternatively, the conductive particles 3 may be metal particles made of tin having a melting point of 232° C. or metal particles made of another material having a melting point of 500° C. or lower. In such a case, the heating temperature of the bonding tool 200 is changed in accordance with the melting point of the conductive particles 3 to a temperature at which the conductive particles 3 are melted and the liquid crystal panel 100 is not damaged.

Figure 8:
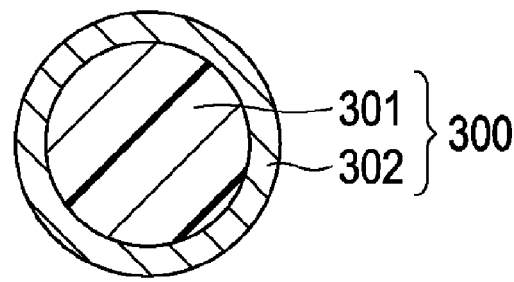
FIG. 8 is a cross-sectional view showing a resin core particle in an ACF.
Figure 9:
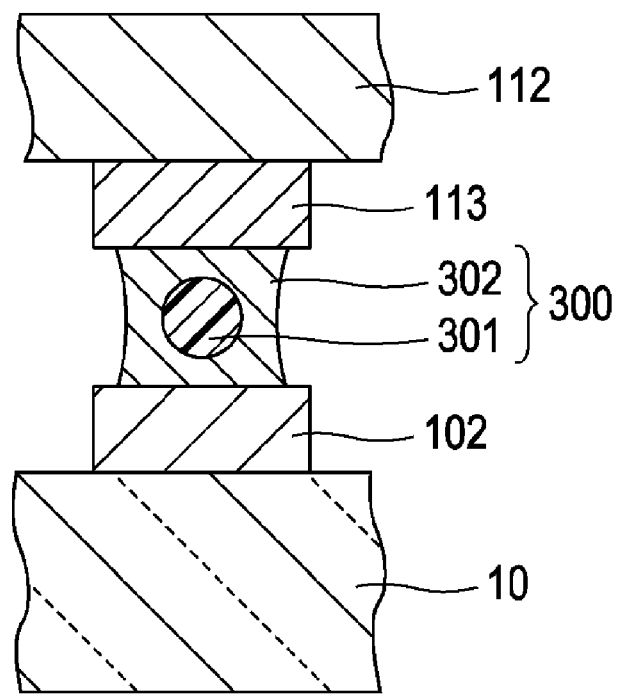
FIG. 9 is a partial cross-sectional view that schematically shows a state in which an external connection terminal is electrically connected to a terminal portion of an FPC by melting a metal plating film of the resin core particle shown in FIG. 8.

Furthermore, another modification will now be described with reference to FIGS. 8 and 9. FIG. 8 is a cross-sectional view showing a resin core particle in an ACF. FIG. 9 is a partial cross-sectional view that schematically shows a state in which an external connection terminal is electrically connected to a terminal portion of an FPC by melting a metal plating film of the resin core particle shown in FIG. 8.

In the above embodiment, the conductive particles 3 are composed of metal particles, but are not limited thereto. Alternatively, as shown in FIG. 8, each of the conductive particles 3 may be composed of a resin core particle 300 in which a metal plating film 302 made of a material having a melting point of 500° C. or lower, namely, a solder or tin, is formed on the surface of a spherical resin 301. The metal plating film 302 may be made of another material as long as the material has a melting point of 500° C. or lower.

In this case, as shown in FIG. 9, during thermocompression bonding in the connection step, when heat is applied from the bonding tool 200 to the ACF 1, the metal plating film 302 of the resin core particle 300 is melted and spread in the form of a fillet, and an external connection terminal 102 and a terminal portion 113 are electrically connected by eutectic bonding with the melted and spread metal plating film 302 therebetween.

In this case, the bonding tool 200 also provides a temperature that is higher than the melting point of the metal plating film 302 but that does not provide the liquid crystal panel 100 with damage due to high heat.

This structure can also realize a reliable electrical connection between the external connection terminal 102 and the terminal portion 113 by eutectic bonding via the melted and spread metal plating film 302 of the resin core particle 300 without proving damage due to high heat to the liquid crystal panel 100 during thermocompression bonding.

In the above embodiment, the ACF 1 is laminated on the external connection terminals 102, but the method is not limited thereto. Alternatively, the ACF may be laminated on the terminal portions 113.

In the above embodiment, a description has been made of an example in which terminal portions 113 of an FPC 112 are electrically connected to external connection terminals 102 using an ACF 1. Alternatively, the above embodiment can be applied to a case where other terminal portions are electrically connected to other terminal portions of a liquid crystal panel 100 using an ACF 1.

In addition, in the above embodiment, the anisotropic conductive adhesive has been described using an ACF as an example, but is not limited thereto. Alternatively, an ACP or another type of anisotropic conductive adhesive can also be used.

The liquid crystal panel is not limited to the above-described example shown in the figures, and various modifications can be made within the scope of the invention. For example, the liquid crystal panel has been described using an active matrix liquid crystal display module including active elements such as thin film transistors (TFTs) as an example. The liquid crystal panel is not limited thereto and may be an active matrix liquid crystal display module including active elements such as thin film diodes (TFDs).

Furthermore, in the above embodiment, an electro-optical device has been described using a liquid crystal device as an example. The invention is not limited thereto and can be applied to various types of electro-optical devices such as electroluminescent devices, in particular, for example, an organic electroluminescent device or an inorganic electroluminescent device, a plasma display device, a field emission display (FED) device, a surface-conduction electron-emitter display (SED) device, a light-emitting diode (LED) display device, an electrophoretic display device, and a device including a thin cathode-ray tube or a liquid crystal shutter.

Alternatively, the electro-optical device may be a device for display in which elements are formed on a semiconductor substrate, for example, a liquid crystal on silicon (LCOS). In the LCOS, a single-crystal silicon substrate is used as an element substrate, and transistors are formed on the single-crystal silicon substrate as switching elements used for pixels and peripheral circuits. Reflective pixel electrodes are used in the pixels, and elements of the pixels are formed on an underlayer of the pixel electrodes.

Alternatively, the electro-optical device may be a device for display in which a pair of electrodes are formed on the same layer of one of substrates, for example, an in-plane switching (IPS), or a device for display in which a pair of electrodes are formed on one of substrates with an insulating film therebetween, for example, fringe field switching (FFS).

The entire disclosure of Japanese Patent Application No. 2008-026021, filed Feb. 6, 2008 is expressly incorporated by reference herein.

What is claimed is:

1. A method of producing an electro-optical device by electrically connecting a first terminal portion provided on an electro-optical panel to a second terminal portion of a substrate, the method comprising:
    disposing one of the electro-optical panel and the substrate on a heater stage;
    applying an anisotropic conductive adhesive containing conductive particles made of a material onto either the first terminal portion or the second terminal portion;
    heating the heater stage to a temperature lower than a melting point of the conductive particles; and
    applying heat and pressure to the other of the electro-optical panel and the substrate for a time period of from approximately 2 to approximately 3 seconds using a pressure bonding device that is disposed on the other of the electro-optical panel and the substrate, the pressure bonding device being heated to a second temperature that is higher than the melting point of the conductive particles, thereby electrically connecting the first terminal portion to the second terminal portion by melting the conductive particles by application of heat in thermocompression bonding of the second terminal portion to the first terminal portion with the anisotropic conductive adhesive therebetween,
    wherein electrically connecting the first terminal portion to the second terminal portion comprises:
        bonding the first terminal portion to the conductive particles by eutectic bonding, and
        bonding the second terminal portion to the conductive particles by eutectic bonding;
    wherein the material of the conductive particles has a melting point of between approximately 260° C. and approximately 280° C.; and
    wherein the second temperature is about 500° C.

2. The method according to claim 1, wherein the conductive particles are composed of metal particles.

* * * * *